United States Patent [19]

Hoessel et al.

US005302421A

[11] Patent Number: 5,302,421

[45] Date of Patent: Apr. 12, 1994

[54] PRODUCTION OF MICROSTRUCTURE ELEMENTS

[75] Inventors: Peter Hoessel, Schifferstadt; Gerhard Hoffmann, Otterstadt, both of Fed. Rep. of Germany

[73] Assignee: BASF Aktiengesellschaft, Ludwigshafen, Fed. Rep. of Germany

[21] Appl. No.: 87,902

[22] Filed: Jul. 9, 1993

[30] Foreign Application Priority Data

Jul. 21, 1992 [DE] Fed. Rep. of Germany ....... 4223888

[51] Int. Cl.⁵ .............................................. B05D 5/12
[52] U.S. Cl. .................................... 427/552; 264/112; 264/219; 427/58; 427/181; 427/195; 427/235; 427/271; 427/374.4; 427/385.5; 427/398.1; 427/595
[58] Field of Search ................. 427/552, 58, 181, 195, 427/235, 271, 374.4, 385.5, 398.1, 595; 264/112, 219

[56] References Cited

FOREIGN PATENT DOCUMENTS 4107662 9/1992 Fed. Rep. of Germany .
4107851 9/1992 Fed. Rep. of Germany .

*Primary Examiner*—Bernard Pianalto
*Attorney, Agent, or Firm*—Keil & Weinkauf

[57] ABSTRACT

A process for the production of microstructure elements having structure depths of from several μm into the mm range by imagewise irradiation of polymers with X-rays and removal of the areas of the polymers which have been irradiated imagewise, comprises applying the polymers, before the imagewise irradiation, to an electroconductive substrate in a layer thickness of from several μm into the mm range by melting under pressure, thus firmly anchoring the polymers.

The process according to the invention is particularly suitable for the production of microstructure elements having structure depths of from 3 to 2000 μm and lateral dimensions of less than 10 μm.

6 Claims, No Drawings

PRODUCTION OF MICROSTRUCTURE ELEMENTS

The present invention relates to a process for the production of microstructure elements having structure depths of from several µm into the mm range by imagewise irradiation of polymers with X-rays and removal of the areas which have been irradiated imagewise, these polymers being firmly anchored to an electroconductive substrate before the imagewise irradiation.

The development of microelectronics has shown that the consequent miniaturization and integration has resulted in a confusing variety of new products with corresponding technologies. In a few years, microelectronics has achieved a considerable lead in miniaturization over other branches of industry. In the meantime, it is emerging that other microtechnologies will in the future also achieve considerable importance; mention should be made, in particular, of micromechanics and integrated optics. In combination with microelectronics, technologies of this type open up an unimaginable number of new electronic, optical, biological and mechanical functional elements.

In the mass production of nonelectronic assemblies, system components and subsystems of microtechnology, the extremely high-performance production methods of semiconductor technology are naturally utilized to a very considerable extent. At the same time, it must be attempted to update classical methods of precision engineering for micromechanics and to fuse them with appropriately modified semiconductor production methods in order to be able to leave the narrow confines of silicon planar technology and to develop new design possibilities based on a wide range of shapes and materials. This requirement is satisfied to a considerable extent by, for example, the LIGA process, which is based on the production steps lithography,
electroforming and
casting and was developed at the Kernforschungszentrum Karlsruhe (KfK).

Interesting microstructure products are sensors for measuring acceleration, flow rate, ultrasound, humidity and the like, micromotors, micropneumatic components, microconnectors for microelectronics, microoptical components, fiber optics, microelectrodes, spinnerets, microfilters, sliding bearings, membranes and many others.

The essential production step of the LIGA process is the structure-accurate irradiation of the polymer employed. The feasibility of the LIGA process has been demonstrated by means of simple microstructures using a specially prepared polymethyl methacrylate (referred to below as PMMA).

For the production of complex three-dimensional structures having structure depths of from several µm to the mm region by the abovementioned LIGA process, the PMMA must be applied to a conductive substrate plate. A special casting process has hitherto been used for this purpose. In this, PMMA dissolved in methyl methacrylate is used as the casting resin, is applied to the electroconductive substrate plate in liquid form in a frame together with specific initiators, catalysts and adhesion promoters and is polymerized under the effect of light or heat.

Processing of a casting resin gives the following problems:
a) the polymerization shrinkage caused by polymerization of the casting resin on the substrate plate results in stresses in the laminate;
b) in order to substantially avoid these stresses, long conditioning during the polymerization and cooling times of up to 24 hours are unavoidable;
c) the selection of polymers is restricted. It is only possible to use polymers which can be polymerized as casting resins or in the form of their monomers during the lamination process;
d) it is not possible to use all commercially available thermoplastics in all solid forms, for example as granules or powders;
e) hitherto only PMMA has been employed as described above for the LIGA process.

In the production of complex three-dimensional structures having structure depths of from several µm into the mm range by the abovementioned LIGA process, it has been found that PMMA requires a large amount of irradiation.

It has furthermore been found that the unirradiated polymer areas swell during development of the irradiated polymer areas with a suitable developer medium, which can destroy fine microstructures. On the other hand, swollen polymer areas can result in stress cracks during drying, resulting in unusable microstructure elements on electroforming. These problems are caused by the high solvent sensitivity of PMMA.

It is an object of the present invention to provide a process which enables the abovementioned problems to be solved. The novel process should enable any desired polymers, in particular those described in German patent applications DE-A-41 07 662, DE-A-41 07 851 and DE-A-41 41 352, to be processed to give a durable polymer/substrate composite. It is a further object of the present invention to develop a process which enables this polymer/substrate composite to be produced accurately and reproducibly in a very short time, i.e. in a few hours or even in minutes.

We have found that, surprisingly, these objects are achieved by a pressing process using a frame which determines the dimensions of the polymer layer.

The present invention accordingly provides a process for the production of microstructure elements having structure depths of from several µm into the mm range by imagewise irradiation of polymers with X-rays and removal of the areas of the polymers which have been irradiated imagewise, which comprises applying the polymers, before the imagewise irradiation, to an electroconductive substrate in a layer thickness of from several µm to the mm range by melting under pressure, thus firmly anchoring the polymers.

Polymers which can be employed for the process according to the invention are preferably amorphous thermoplastics or partially crystalline thermoplastics, which are each melted during the pressing process.

The X-rays employed for the imagewise irradiation are preferably synchrotron radiation.

The process according to the invention is particularly suitable for the production of microstructure elements with structure depths of from 3 to 2000 µm and lateral dimensions of less than 10 µm.

Preference is also given to an embodiment of the process according to the invention for the production of microstructure elements in which the polymers, before irradiation, are laminated onto the substrate under pressure by melting in a frame.

The following details apply to the process according to the invention.

The pressing mold used is preferably a frame, whose lateral dimensions determine the resist area desired and whose height determines the approximate resist thickness. The preferred material for the frame is a metal, e.g. steel.

In general, layer thicknesses of from 3 to 2000 μm are required. Particular preference is given to layer thicknesses of from 40 to 650 μm.

The frame is preferably simply laid on the substrate plate or fixed to the substrate plate by means of a holder or firmly connected to the baseplate during the pressing operation, for example by means of screws. In order to prevent the polymer migrating downward between the frame and baseplate during the pressing operation, the underside of the frame is preferably polished or lapped and has a surface roughness of less than 200 nm.

The frame may additionally contain side channels, through which the excess polymer material can flow out during the pressing operation.

The internal dimensions of the frame, which determine the resist area, can be freely selected. For example, they can be from 20×50 mm to 125×125 mm.

Examples of electroconductive substrates or baseplates which can be used are metal plates, e.g. copper, aluminum or steel, for example having the dimensions from 70 to 150×50 to 150×2 to 15 mm, preferably from 100 to 125×70 to 125×8 mm. Preference is given to copper plates having electroconductive adhesive layers in thicknesses of from 1 to 10 μm, preferably from 3.5 to 6 μm, which are specially adapted for the particular polymer used. Particular preference is given to electroconductive adhesive layers comprising surface-oxidized titanium.

Polymers which can be used are in principle all known amorphous or partially crystalline thermoplastics, in particular those having glass transition temperatures of from 50° to 200° C., for example amorphous thermoplastics having softening points of above 120° C. or partially crystalline thermoplastics having melting points of above 120° C.

Preference is given to polymethyl methacrylate in the form of granules, having a mean molecular weight of from 100,000 to 400,000, and partially crystalline polymers having melting points of from 140° to 240° C., e.g. polyoxymethylenes, polyalkene sulfones and aliphatic polyesters, as described, for example, in DE 41 07 662, DE 41 07 851 and DE 41 41 352.

The pressing operation in the process according to the invention is carried out at from 100° to 350° C., preferably at from 180° to 240° C.

Before pressure is applied, the polymer in solid form is introduced into the frame, which is located on the baseplate. An excess of the polymer is preferably employed. The excess is dependent on the geometry of the frame and on the type of polymer employed.

After a hold time of about 1-10 minutes, a pressure of from 20 to 400 bar is exerted on the polymer or on the frame for about 1-10 minutes. The hold time and pressure are dependent on the type of polymer employed.

The cooling time to from 20° to 30° C. is generally from 10 to 40 minutes.

The polymers (resists) applied by the above-described process have layer thicknesses of up to 2000 μm, preferably from 40 to 650 μm. The surface roughness is less than 200 nm. After reworking of the polymer layer by micromilling, the overall deviation of the layer thickness above the entire resist area can be adjusted to less than 15 μm.

After irradiation with synchrotron radiation through special X-ray masks and development of the polymers in the form of the polymer/substrate composites produced according to the invention, the microstructures are obtained in the desired precision.

Since the polymers are located on an electroconductive baseplate, the subsequent steps of electroforming and casting which are conventional in the LIGA process can subsequently be carried out.

EXAMPLE

A copper plate with a thickness of 8 mm was coated with about 6 μm of titanium which had been surface-oxidized by means of hydrogen peroxide. A frame having the internal dimensions 80.00×30.00 mm and a height of 0.350 mm was then placed on the substrate plate pretreated in this way. 1.260 g of polymethyl methacrylate having a mean molecular weight $\overline{M}_w$ of 300,000 were introduced into this frame, and the frame was then placed in the press preheated to 210° C.

After a hold time of 1 minute, the polymer or the frame was pressed for 4 minutes at a pressure of 100 bar at 210° C., and was subsequently cooled at 25° C. over the course of 30 minutes.

After removal of the frame, the layer thickness of the polymer was 350±50 μm. After micromilling, the layer thickness of the polymer was 350±15 μm. The surface roughness was less than 0.2 μm.

After synchrotron irridation through a special X-ray mask and development using an adapted developer (GG developer, see DE 30 39 110 C2), microstructures of polymethyl methacrylsate, e.g. columns having a diameter of 45 μm, located on a conductive layer of titanium, were obtained. It was then possible to carry out the subsequent steps of electroforming and casting which are conventional in the LIGA process.

We claim:

1. A process for the production of microstructure elements having structure depths of from several μm into the mm range by imagewise irradiation of polymers with X-rays and removal of the areas of the polymers which have been irradiated imagewise, which comprises applying the polymers, before the imagewise irradiation, to an electroconductive substrate in a layer thickness of from several μm into the mm range by melting under pressure, thus firmly anchoring the polymers.

2. A process as claimed in claim 1, wherein the polymers employed are amorphous thermoplastics which are melted during the pressing process.

3. A process as claimed in claim 1, wherein the polymers employed are partially crystalline thermoplastics which are melted during the pressing process.

4. A process as claimed in claim 1, wherein the polymers are surrounded by a frame mounted on the electroconductive substrate.

5. A process as claimed in claim 1, wherein the X-rays employed for the imagewise irradiation are synchrotron radiation.

6. A process as claimed in claim 1, wherein microstructure elements having structure depths of from 3 to 2000 μm and lateral dimensions of less than 10 μm are produced.

* * * * *

UNITED STATES PATENT AND TRADEMARK OFFICE
CERTIFICATE OF CORRECTION

PATENT NO. : 5,302,421
DATED : April 12, 1994
INVENTOR(S) : HOESSEL et al.

It is certified that error appears in the above-indentified patent and that said Letters Patent is hereby corrected as shown below:

Claim 5, column 4, lines 61-62, "synchrontron" should be --synchrotron--.

Signed and Sealed this

Thirtieth Day of August, 1994

Attest:

BRUCE LEHMAN

*Attesting Officer*   *Commissioner of Patents and Trademarks*